(12) United States Patent
Wu et al.

(10) Patent No.: US 10,079,265 B1
(45) Date of Patent: Sep. 18, 2018

(54) MICRO LIGHT-EMITTING DIODE APPARATUS AND DISPLAY PANEL

(71) Applicant: PlayNitride Inc., Tainan (TW)

(72) Inventors: Chih-Ling Wu, Tainan (TW); Yu-Hung Lai, Tainan (TW); Yi-Min Su, Tainan (TW); Yu-Yun Lo, Tainan (TW); Tzu-Yang Lin, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 15/658,405

(22) Filed: Jul. 25, 2017

(30) Foreign Application Priority Data

May 16, 2017 (TW) .............................. 106116055 A

(51) Int. Cl.
*H01L 33/20* (2010.01)
*H01L 27/15* (2006.01)
*H01L 33/62* (2010.01)

(52) U.S. Cl.
CPC ............ *H01L 27/156* (2013.01); *H01L 33/20* (2013.01); *H01L 33/62* (2013.01)

(58) Field of Classification Search
CPC ....... H01L 27/15; H01L 27/156; H01L 33/00; H01L 33/20; H01L 33/60; H01L 33/62; H01L 33/0079; H01L 31/02; H01L 31/06; H01L 31/0256; H01L 31/062; H01L 33/14; H01L 33/22; H01L 33/42; H01L 33/40; H01L 33/44; H01L 33/50; H01L 33/58; H01L 33/32; H01L 33/502; H01L 33/54
USPC .......................................................... 257/89
See application file for complete search history.

(56) References Cited

U.S. PATENT DOCUMENTS

2004/0227238 A1* 11/2004 Hashimoto ............. H01L 24/24
257/738
2005/0063174 A1* 3/2005 Kaminsky ............ G02B 5/0221
362/600

FOREIGN PATENT DOCUMENTS

CN 105870265 8/2016
TW 201624777 7/2016

OTHER PUBLICATIONS

"Office Action of Taiwan Counterpart Application," dated Jul. 31, 2017, p. 1-p. 11, in which.

* cited by examiner

*Primary Examiner* — Chuong A Luu
(74) *Attorney, Agent, or Firm* — JCIPRNET

(57) ABSTRACT

A display panel including a backplane, a first bonding layer, a plurality of micro light-emitting diodes, a first insulation layer, and a second bonding layer is provided. The first bonding layer is disposed on the backplane. The micro light-emitting diodes are disposed on the first bonding layer and are electrically connected to the first bonding layer. The first insulation layer is located between any adjacent two of the micro light-emitting diodes. The first insulation layer has a concave-convex surface. The second bonding layer is disposed on the micro light-emitting diodes and the first insulation layer and is electrically connected to the micro light-emitting diodes. A micro light-emitting diode apparatus including a substrate, a plurality of micro light-emitting diodes, and a first insulation layer is provided. The first insulation layer is located between any adjacent two of the micro light-emitting diodes. The first insulation layer has a concave-convex surface.

7 Claims, 3 Drawing Sheets

MICRO LIGHT-EMITTING DIODE APPARATUS AND DISPLAY PANEL

CROSS-REFERENCE TO RELATED APPLICATION

This application claims the priority benefit of Taiwan application serial no. 106116055, filed on May 16, 2017. The entirety of the above-mentioned patent application is hereby incorporated by reference herein and made a part of this specification.

BACKGROUND OF THE INVENTION

1. Field of the Invention

The invention relates to a light-emitting diode apparatus and a light-emitting diode display panel. More particularly, the invention relates to a micro light-emitting diode apparatus and a micro light-emitting diode display panel (Micro LED Display Panel).

2. Description of Related Art

With progress in photoelectric technologies, conventional incandescent light bulbs and fluorescent tubes have been gradually replaced by a new generation of solid-state light source (e.g., a light-emitting diode) owing to problems such as efficiency and environmental protection. In recent years, the application scope of the light-emitting diode has been expanded to road illumination, large outdoor display boards, traffic signal lights, and the like. In the field of the light-emitting diode, a new technology called as a micro light-emitting diode (Micro LED) has been developed with a relatively small size compared to a general light-emitting diode.

When micro light-emitting diodes are applied to the display technology, each of the micro light-emitting diode may act as a sub-pixel in a display panel, and each of the sub-pixels can be addressed and driven to emit light individually. The display panel in which the light beams emitted by the micro light-emitting diodes which can emit light individually are combined into an image is the micro light-emitting diode display panel. Since the micro light-emitting diodes are equipped with the characteristic of the display technology of self light emitting, compared to organic light emitting diodes (OLED) which are also equipped with the display technology of self light emitting, the micro light-emitting diodes are characterized by great efficiency, long service life, and favorable stability as the material of the micro light-emitting diodes is less susceptible to environmental influences. Thereby, the micro light-emitting diodes are likely to be more widely adopted than the organic light emitting diodes and become the mainstream display technology in the future.

Nevertheless, in the manufacturing process of the micro light-emitting diodes, the following problem occurs easily. When common electrodes are to be manufactured to cover the micro light-emitting diodes, the common electrodes are overly deformed most of the time between adjacent two of the micro light-emitting diodes and thus are fractured owing to gravity, and such phenomenon causes the manufacturing yield rate of the micro light-emitting diode display panel to be reduced.

SUMMARY OF THE INVENTION

The invention provides a micro light-emitting diode apparatus and a display panel with favorable manufacturing yield rates.

In an embodiment of the invention, a display panel including a backplane, a first bonding layer, a plurality of micro light-emitting diodes, a first insulation layer, and a second bonding layer is provided. The first bonding layer is disposed on the backplane. The micro light-emitting diodes are disposed on the first bonding layer and are electrically connected to the first bonding layer. The first insulation layer is located between any adjacent two of the micro light-emitting diodes, and the first insulation layer has a concave-convex surface. The second bonding layer is disposed on the micro light-emitting diodes and the first insulation layer and is electrically connected to the micro light-emitting diodes.

In an embodiment of the invention, the first insulation layer includes at least one convex portion, a plurality of concave portions, and a plurality of connecting portions. The convex portion is located between adjacent two of the concave portions. The connecting portion is located between the concave portions and the micro light-emitting diodes. The connecting portion is connected to the micro light-emitting diodes. A surface of the at least one convex portion, surfaces of the concave portions, and surfaces of the connecting portions together constitute a surface of the first insulation layer.

In an embodiment of the invention, the display panel further satisfies: H1>H2>H3. H1 is a maximum height of the at least one convex portion relative to the backplane, H2 is a maximum height of a connection part between the connecting portion and the micro light-emitting diode relative to the backplane, and H3 is a minimum height of the concave portion relative to the backplane.

In an embodiment of the invention, the display panel further satisfies: a value of a ratio of H1 to H3 is greater than 1 and less than and equal to 2.

In an embodiment of the invention, the display panel further satisfies: (H2+H3)>H1>1/2*(H2+H3). H1 is the maximum height of the at least one convex portion relative to the backplane, H2 is the maximum height of the connection part between the connecting portion and the micro light-emitting diode relative to the backplane, and H3 is the minimum height of the concave portion relative to the backplane.

In an embodiment of the invention, the display panel further satisfies: $H_L$>H2, $H_L$>H3. H2 is the maximum height of the connection part between the connecting portion and the micro light-emitting diode relative to the backplane, H3 is the minimum height of the concave portion relative to the backplane, and $H_L$ is a maximum height of the micro light-emitting diode relative to the backplane.

In an embodiment of the invention, each of the micro light-emitting diodes includes an epitaxial structure, and the epitaxial structure includes a first-type semiconductor layer, a second-type semiconductor layer, and a light-emitting layer. The light-emitting layer is located between the first-type semiconductor layer and the second-type semiconductor layer. The first electrode is disposed between the first bonding layer and the first-type semiconductor layer and is electrically connected to the first-type semiconductor layer. The second electrode is disposed between the second bonding layer and the second-type semiconductor layer and is electrically connected to the second-type semiconductor layer.

In an embodiment of the invention, the display panel further satisfies: H2>$H_M$. H2 is the maximum height of the connecting portion relative to the backplane, and $H_M$ is the maximum height of the light-emitting layer relative to the backplane.

In an embodiment of the invention, the connecting portion is connected to and covers a side surface of the epitaxial structure and a side surface of the first electrode.

In an embodiment of the invention, looking from a cross-sectional view, a cross-sectional shape of the epitaxial structure of each of the micro light-emitting diodes is a trapezoid, and an angular range of a base angle of the trapezoid falls between 45 degrees and 85 degrees.

In an embodiment of the invention, the first-type semiconductor layer is an n-type semiconductor layer, and the second-type semiconductor layer is a p-type semiconductor layer.

In an embodiment of the invention, the backplane includes a plurality of pixels. The pixels include a plurality of sub-pixels. At least one of the micro light-emitting diodes is located in one of the sub-pixels.

In an embodiment of the invention, a micro light-emitting diode apparatus including a substrate, a plurality of micro light-emitting diodes, and a first insulation layer is provided. The micro light-emitting diodes are disposed on the substrate. The first insulation layer is located between any adjacent two of the micro light-emitting diodes. The first insulation layer has a concave-convex surface and includes at least one convex portion, a plurality of concave portions, and a plurality of connecting portions. The at least one convex portion is located between adjacent two of the concave portions. The connecting portions are located between the concave portions and the micro light-emitting diodes. The connecting portions are connected to the micro light-emitting diodes. A surface of the at least one convex portion, surfaces of the concave portions, and surfaces of the connecting portions together constitute a surface of the first insulation layer. The micro light-emitting diode apparatus further satisfies: H1>H2>H3. H1 is a maximum height of the at least one convex portion relative to the substrate, H2 is a maximum height of a connection part between the connecting portion and the micro light-emitting diode relative to the substrate, and H3 is a minimum height of the concave portion relative to the substrate.

In an embodiment of the invention, the micro light-emitting diode apparatus further satisfies: a value of a ratio of H1 to H3 is greater than 1 and less than and equal to 2.

In an embodiment of the invention, the micro light-emitting diode apparatus further satisfies: (H2+H3)>H1>1/2*(H2+H3). H1 is a maximum height of the at least one convex portion relative to the backplane, H2 is the maximum height of a connection part between the connecting portion and the micro light-emitting diode relative to the substrate, and H3 is the minimum height of the concave portion relative to the substrate.

In an embodiment of the invention, the micro light-emitting diode apparatus further satisfies: $H_L$>H2, $H_L$>H3. H2 is the maximum height of the connection part between the connecting portion and the micro light-emitting diode relative to the substrate, H3 is the minimum height of the concave portion relative to the substrate, and $H_L$ is a maximum height of the micro light-emitting diode relative to the substrate.

In an embodiment of the invention, each of the micro light-emitting diodes includes an epitaxial structure, and the epitaxial structure includes a first-type semiconductor layer, a second-type semiconductor layer, and a light-emitting layer. The light-emitting layer is located between the first-type semiconductor layer and the second-type semiconductor layer. The micro light-emitting diode apparatus further satisfies: H2>$H_M$. H2 is the maximum height of the connecting portion relative to the substrate, and $H_M$ is a maximum height of the light-emitting layer relative to the substrate.

In an embodiment of the invention, the connecting portion is connected to and covers a side surface of the epitaxial structure.

In an embodiment of the invention, the first-type semiconductor layer is an n-type semiconductor layer, and the second-type semiconductor layer is a p-type semiconductor layer.

To sum up, in the micro light-emitting diode apparatus and the display panel provided by the embodiments of the invention, as each of the first insulation layers located between any adjacent two of the micro light-emitting diodes has the concave-convex surface, such that, when the second bonding layer is disposed on the micro light-emitting diodes and the first insulation layer, the second bonding layer is less likely to be deformed due to the first insulation layers, and the second bonding layer can be less likely to be fractured. Thereby, the micro light-emitting diode apparatus and the display panel provided by the embodiments of the invention have favorable manufacturing yield rates.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
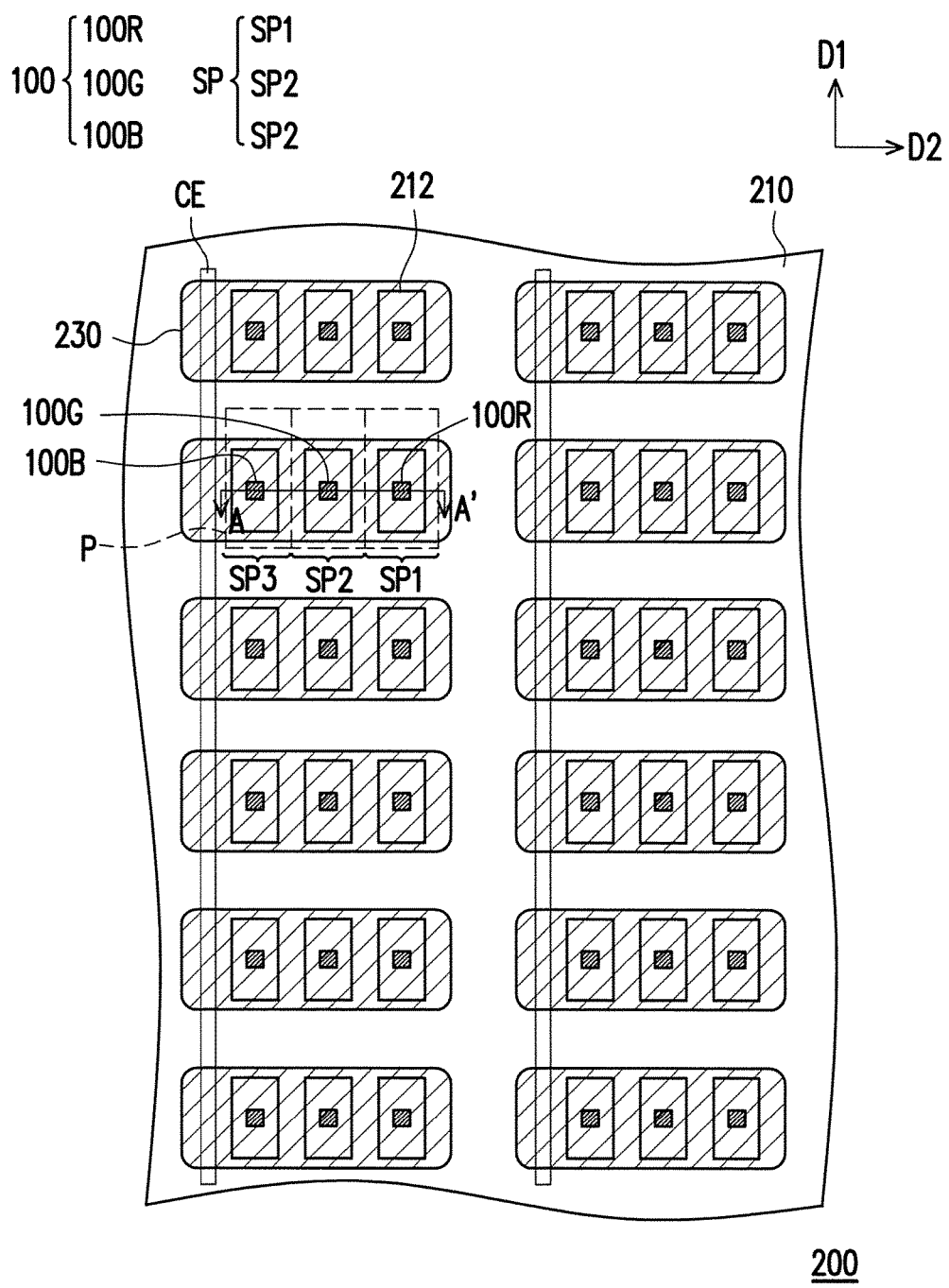
FIG. 1A is a schematic local top view of a display panel according to an embodiment of the invention.
Figure 1B:
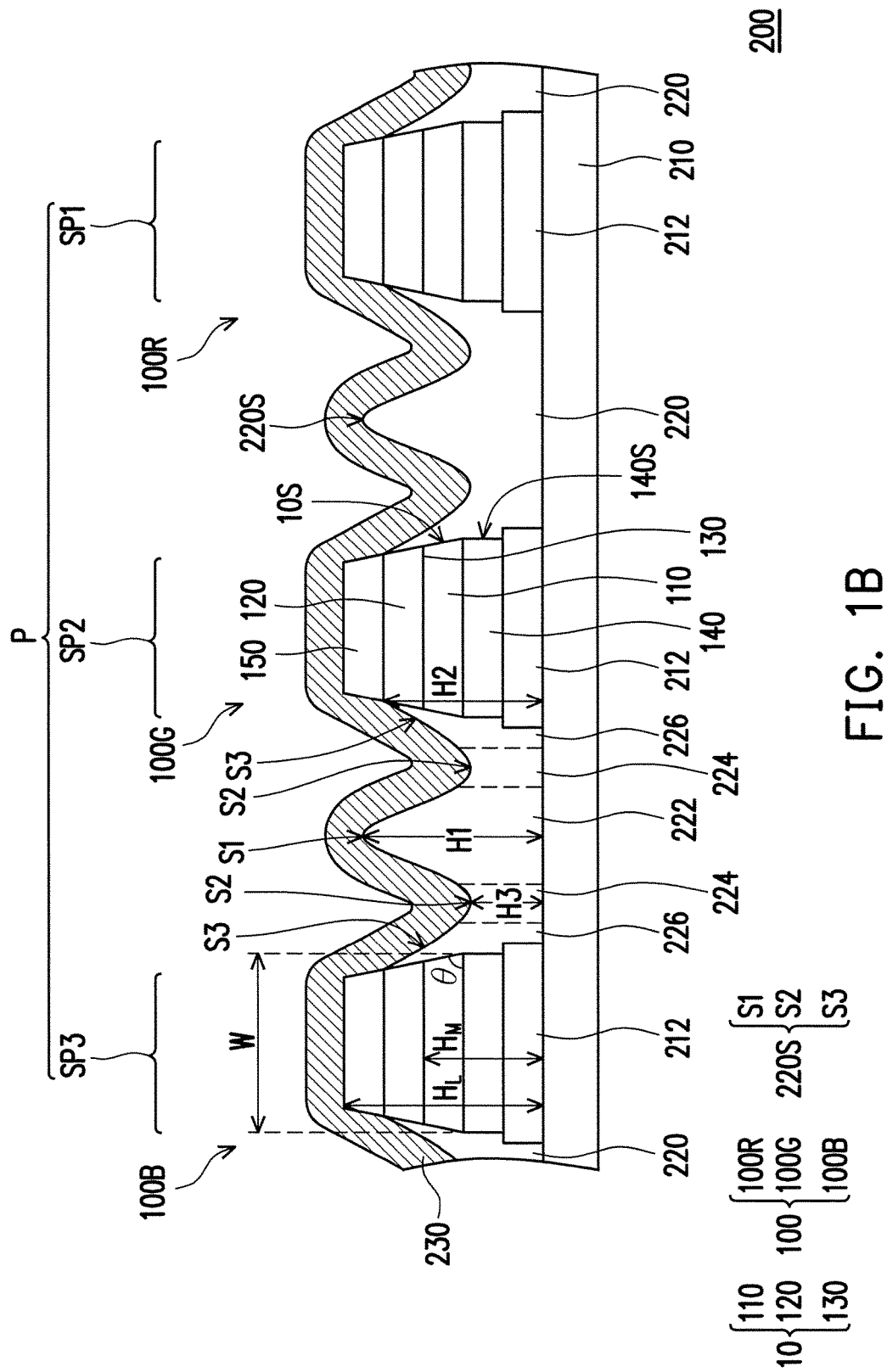
FIG. 1B is a schematic cross-sectional view taken along a cross-sectional line A-A' in FIG. 1A.

FIG. 1A is a schematic local top view of a display panel according to an embodiment of the invention. FIG. 1B is a schematic cross-sectional view taken along a cross-sectional line A-A' in FIG. 1A.

Referring to FIG. 1A and FIG. 1B, in the present embodiment, a display panel 200 is implemented as a micro light-emitting diode display panel. An implementation of a micro light-emitting diode apparatus is, for example, a micro light-emitting diode display panel. The display panel 200 includes a backplane 210, a first bonding layer, 212, a plurality of micro light-emitting diodes 100, a first insulation layer 220, and a second bonding layer 230. The first bonding layer 212 is disposed on the backplane 210. The micro light-emitting diodes 100 are disposed on the first bonding layer 212 and are electrically connected to the first bonding layer 212. Here, the first bonding layer 212 is a discontinuous patterned structure. Each of the micro light-emitting diodes 100 is respectively and correspondingly disposed on the first bonding layer 220, but in the embodiments that are not illustrated, the first bonding layer 212 may also be a continuous layer structure. The invention is not limited thereto. The first insulation layer 220 is located between any adjacent two of the micro light-emitting diodes 100, and the first insulation layer 220 has a concave-convex surface 220S. The second bonding layer 230 is disposed on the micro light-emitting diodes 100 and the first insulation layer 220 and is, for example, conformally disposed on a portion of surfaces of the micro light-emitting diodes 100 and the surface 220S of the first insulation layer 220. The second bonding layer 230 is electrically connected to the micro light-emitting diodes 100. The second bonding layer 230 may be viewed as a common electrode in the display panel 200. It is worth noting that in the embodiments that are not illustrated, the micro light-emitting diode apparatus provided by the embodiments of the invention may be other types of micro light-emitting diode apparatuses, and the invention is not limited to the display panel herein.

In the present embodiment, a material of the first insulation layer 220 may be a thermal curing insulation material or a photo curing insulation material, for example, a photo resist material, but the invention is not limited thereto. A material of the first bonding layer 212 includes a metal material, for example, gold (Au), copper (Cu), tin (Sn), indium (In), an alloy combining the foregoing materials, and a combination of the foregoing materials. A material of the second bonding layer 230 includes a transparent or translucent conductive material, for example, a combination of indium tin oxide (ITO), conductive polymer compound, metal thin layer, and graphene, but the invention is not limited thereto. A value of Young's Modulus of the first bonding layer 212 is less than a value of Young's Modulus of the second bonding layer 230. Therefore, the first bonding layer 212 could be provided as a buffer when the second bonding layer 230 is disposed thereon.

Referring to FIG. 1A, the backplane 210 includes a plurality of pixels P. Each of the pixels P includes a plurality of sub-pixels SP. At least one of the micro light-emitting diodes 100 is located in one of the sub-pixels SP. Specifically, each of the pixels P includes at least three sub-pixels SP, but the invention is not limited thereto. In the present embodiment, a red light micro light-emitting diode 100R is, for example, disposed in a sub-pixel SP1, a blue light micro light-emitting diode 100B is, for example, disposed in a sub-pixel SP2, and a green light micro light-emitting diode 100G is disposed in a sub-pixel SP3. But the invention is not limited thereto. In other words, the pixels P of the display panel 200 can emit a combination of the red light, green light, or blue light, but the invention is not limited thereto. The display panel 200 further includes a plurality of connecting electrodes CE. Each of the connecting electrodes CE extends in a direction of D1. Each of the second bonding layers 230 extends in a direction D2. Each of the connecting electrodes CE is connected to each of the second bonding layers 230. Referring to FIG. 1A, here, the second bonding layers 230 are discontinuous patterned structures disposed on a portion of the micro light-emitting diodes 100 (e.g., disposed on three micro light-emitting diodes 100). Nevertheless, in the embodiments that are not illustrated, the second bonding layer 230 may also be a continuous layer structure disposed on the micro light-emitting diodes 100 at the same time. In other words, the second bonding layer 230 is disposed on the micro light-emitting diodes 100 as a whole. Specifically, in the present embodiment, the display panel 200 transmit a signal through the connecting electrodes CE to control whether the micro light-emitting diodes 100 in each of the sub-pixels SP emit light through a driving unit (not shown) in the backplane 210, so as to control images shown by the pixels P. People having ordinary skill in the art may acquire sufficient teachings, suggestions, and other details related to the operating and implementation methods of the display panel 200, and that detailed descriptions are not further provided hereinafter.

In the present embodiment, the backplane 210 is implemented as a thin film transistor (TFT) substrate. In the rest of the embodiments, the backplane 210 may be a semiconductor substrate, a submount, a complementary metal-oxide-semiconductor (CMOS) circuit substrate, a liquid crystal on silicon (LCOS) substrate, or other types of substrates with driving units disposed, and the invention is not limited thereto. Referring to FIG. 1B, a size of side length W of each of the micro light-emitting diodes 100 is micro-sized, and a range of the size of side length W of each of the micro light-emitting diodes 100 falls between, for example, 1 micron and 30 microns.

As described above, in the micro light-emitting diode apparatus and the display panel 200 of the present embodiment, since the first insulation layer 220 located between any adjacent two of the micro light-emitting diodes 100 has the concave-convex surface 220S, when the second bonding layer 230 is disposed on the micro light-emitting diodes 100 and the first insulation layer 220, the second bonding layer 230 is less likely to be deformed due to the first insulation layer 220. Especially when a material that has less extension capability, such as ITO, is used for the second bonding layer 230, even though the second bonding layer 230 is disposed along the surface 220S of the first insulation layer 220, the second bonding layer 230 can be less likely to be fractured. Thereby, the display panel 200 of the present embodiment has a favorable manufacturing yield rate.

Referring to FIG. 1B, looking from a cross-sectional view, in the present embodiment, the first insulation layer 220 includes at least one convex portion 222, a plurality of concave portions 224, and a plurality of connecting portions 226. The convex portion 222 is located between any adjacent two of the concave portions 224. The connecting portion 226 is located between the concave portion 224 and the micro light-emitting diode 100. The connecting portion 226 is connected to the micro light-emitting diode 100. A surface S1 of the at least one convex portion 222, surfaces S2 of the concave portions 224, and surfaces S3 of the connecting portions 226 together constitute the surface 220S of the first insulation layer 220. Specifically, in the present embodiment, the first insulation layer 220 includes, for example, one convex portion 212, two concave portions 214, and two connecting portions 216, but the invention is not limited thereto. Looking from another viewpoint, a cross-sectional shape of the first insulation layer 220 is, for example, a wave shape. In the rest of the embodiments that are not shown, the cross-sectional shape of the first insulation layer 220 is, for example, a mountain shape or may be, for example, a concave shape. As long as the surface of the first insulation layer 220 is the concave-convex surface 220S, and the invention is not limited to the cross-sectional shape of the first insulation layer 220.

In the present embodiment, the display panel 200 further satisfies the following formula:

$$H1>H2>H3$$

H1 is a maximum height of the at least one convex portion 222 relative to the backplane 210, H2 is a maximum height of a connection part between the connecting portion 226 and the micro light-emitting diode 100 relative to the backplane 210 (here, a connection part between the connecting portion 226 and the micro light-emitting diode 100G is taken for example), and H3 is a minimum height of the concave portion 224 relative to the backplane 210. As the first insulation layer 220 is designed to have a higher middle portion and two lower side portions, such that larger bonding space is created when manufacturing the second bonding layer 230 subsequently, and that when the second boding layer 230 is disposed along the surface 220S of the first insulation layer 220, the second bonding layer 230 is less likely to be deformed, and thus the second bonding layer 230 can be less likely to be fractured. Here, a value of a ratio of H1 to H3 (H1/H3) is preferably greater than 1 and less than and equal to 2, such that a difference between the convex and the concave portions may not be substantial. Preferably, the value of the ratio of H1 to H3 (H1/H3) is greater than 1 and less than and equal to 1.2, such that the difference between the convex and the concave portions may be decreased, which is more suitable for following manufacturing process. It is worth noting that the display panel 200 further satisfies the formula: (H2+H3)>H1>1/2*(H2+H3), and that when the second bonding layer 230 is disposed along the surface 220S of the first insulation layer 220, the display panel 200 may have a favorable manufacturing yield rate.

In the present embodiment, the light-emitting diode 100 is implemented as a vertical type light-emitting diode. The micro light-emitting diode 100 includes an epitaxial structure 10, a first electrode 140, and a second electrode 150. The epitaxial structure 10 includes a first-type semiconductor layer 10, a second-type semiconductor layer 120, and a light-emitting layer 130. The light-emitting layer 130 is located between the first-type semiconductor layer 110 and the second-type semiconductor layer 120. The first electrode 140 and the second electrode 150 are respectively located on two opposite sides of the epitaxial structure 10. The first electrode 140 is disposed between the first bonding layer 212 and the first-type semiconductor layer 110 and is electrically connected to the first-type semiconductor layer 110. The second electrode 150 is disposed between the second bonding layer 230 and the second-type semiconductor layer 120 and is electrically connected to the second-type semiconductor layer 120.

In the present embodiment, the first-type semiconductor layer 110 is, for example, an n-type semiconductor layer and is, for example, an n-type gallium nitride (N-GaN) layer, but the invention is not limited thereto. The second-type semiconductor layer 120 is, for example, a p-type semiconductor layer and is, for example, a p-type gallium nitride (P-GaN) layer, but the invention is not limited thereto. The light-emitting layer 130 is, for example, a multiple quantum well (MQW) layer, and is, for example, a multiple quantum well layer formed by a multi-layer indium gallium nitride layer and a multi-layer gallium nitride layer (InGaN/GaN) stacked alternately, but the invention is not limited thereto. A material of the first electrode 140 includes a transparent or translucent conductive material, such as, indium tin oxide (ITO), conductive polymer compound, and graphene. A material of the second electrode 150 includes a metal material, such as, platinum (Pt), nickel (Ni), titanium (Ti), gold (Au), chromium (Cr), an alloy combining the foregoing materials, and a combination of the foregoing materials, but the invention is not limited thereto. It is worth noting that a thickness of the second electrode 150 being greater than a thickness of the second-type semiconductor layer 120, such that an ohmic contact between the two is increased, so as to prevent the second-type semiconductor layer 120 to be overly thick to absorb lights.

Referring again to FIG. 1B, in the present embodiment, looking from a cross-sectional view, a cross-sectional shape of the epitaxial structure 10 of each of the micro light-emitting diodes 100 is a trapezoid. Because a location of a base angle θ of the trapezoid is adjacent to the backplane 210, when being manufactured on the micro light-emitting diodes 100 in the subsequent process, the first insulation layer 220 and the second bonding layer 230 may thus be prevented from being influenced by angular differences caused by the light-emitting diodes 100, and a favorable manufacturing yield rate can be obtained. The base angle θ of the trapezoid is an acute angle, and an angular range of the base angle θ falls between 45 degrees and 85 degrees. But the invention is not limited thereto.

In the present embodiment, the display panel 200 further satisfies the following formula:

$$H2 > H_M$$

H2 is the maximum height of the connection part between the connecting portion 226 and the micro light-emitting diode 100 relative to the backplane 210 (here, the connection part between the connecting portion 226 and the micro light-emitting diode 100G is taken for example), and $H_M$ is a maximum height of the light-emitting layer 130 relative to the backplane 210. In other words, the connecting portion 226 of the first insulation layer 220 covers the light-emitting layer 130, and thus, favorable insulation and protection effects are achieved. Preferably, the connecting portion 226 of the first insulation layer 220 covers a side surface 10S of the epitaxial structure 10 and a side surface 140S of the first electrode 140. In other words, as the connection part between the connecting portion 226 and the micro light-emitting diode 100 is a juncture between the second electrode 150 and the epitaxial structure 10, the second electrode 150 is completely exposed. As such, in the subsequent process, a connection area between the second bonding layer 230 and the second electrode 150 is increased and a favorable ohmic contact is thus achieved, and moreover, favorable insulation and protection effects are provided to the epitaxial structure 10 and the first electrode 140.

In the present embodiment, the display panel 200 further satisfies the following formula:

$$H_L > H2, H_L > H3$$

$H_L$ is a maximum height of the micro light-emitting diode 100 relative to the backplane 210. In the present embodiment, $H_L$, is, for example, a distance between a surface of the first electrode 140 of the micro light-emitting diode 100 distant most from the backplane 210 and the backplane 210, and $H_L \geq H1$, preferably. As the differences between the convex and concave portions of the first insulation layer 220 are less than the maximum height of the micro light-emitting diode 100 relative to the backplane 210, a favorable manufacturing yield rate is thus obtained.

It should be explained that a part of the contents in the previous embodiments are used in the following embodiments, in which repeated description of the same technical contents is omitted, and elements which are named identically may be referred the part of the contents. A detailed description will not be repeated in the following embodiments.

Figure 2:
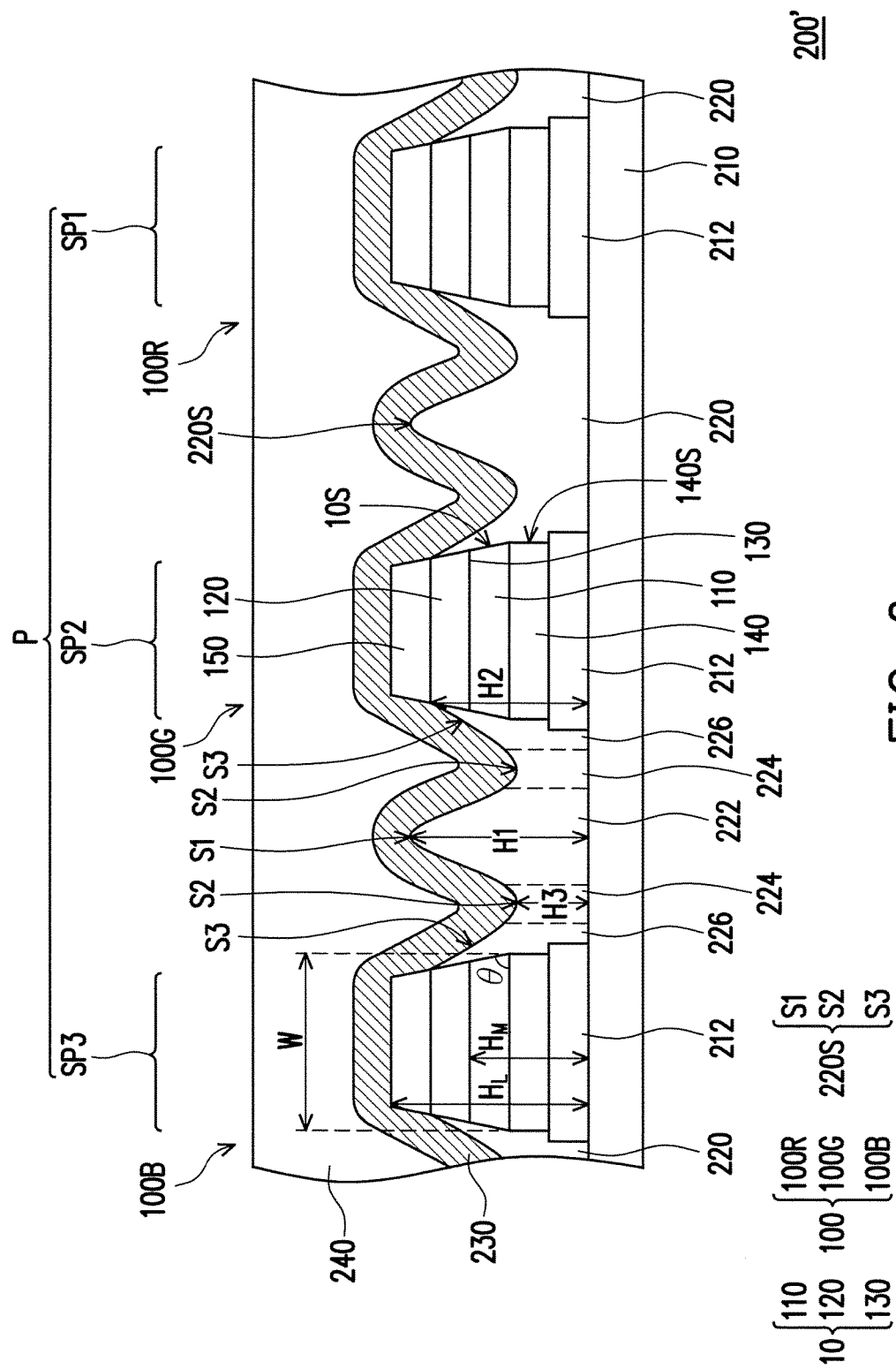
FIG. 2 is a schematic local cross-sectional view of a display panel according to another embodiment of the invention.

FIG. 2 is a schematic local cross-sectional view of a display panel according to another embodiment of the invention. Referring to FIG. 2, a display panel 200' of the present embodiment is substantially similar to the display panel 200 of FIG. 1A and FIG. 1B, and differences therebetween are described as follows. The display panel 200' of FIG. 2 further includes a second insulation layer 240. The second insulation layer 240 is disposed on the second bonding layer 230 and can be used to protect the display panel 200', such that a service life of the display panel 200' may be prolonged.

In view of the foregoing, in the micro light-emitting diode apparatus and the display panel provided by the embodiments of the invention, as the first insulation layer located between any adjacent two of the micro light-emitting diodes has the concave-convex surface, such that, when the second bonding layer is disposed on the micro light-emitting diodes and the first insulation layer, the second bonding layer is less likely to be deformed thanks to the first insulation layer, and the second bonding layer can be less likely to be fractured when being disposed along the concave-convex surface of the first insulation layer. Thereby, the micro light-emitting diode apparatus and the display panel provided by the embodiments of the invention have favorable manufacturing yield rates.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A micro light-emitting diode apparatus, comprising:
a substrate;
a plurality of micro light-emitting diodes, disposed on the substrate; and
a first insulation layer, located between any adjacent two of the micro light-emitting diodes, wherein the first insulation layer has a concave-convex surface and comprises:
at least one convex portion;
a plurality of concave portions, the at least one convex portion being located between adjacent two of the concave portions; and
a plurality of connecting portions, the connecting portions being located between the concave portions and the micro light-emitting diodes, the connecting portions being connected to the micro light-emitting diodes, wherein a surface of the at least one convex portion, surfaces of the concave portions, and surfaces of the connecting portions together constitute a surface of the first insulation layer, and the micro light-emitting diode apparatus further satisfies: $H1 > H2 > H3$, wherein $H1$ is a maximum height of the at least one convex portion relative to the substrate, $H2$ is a maximum height of a connection part between the connecting portion and the micro light-emitting diode relative to the substrate, and $H3$ is a minimum height of the concave portion relative to the substrate.

2. The micro light-emitting diode apparatus as claimed in claim 1, wherein the micro light-emitting diode apparatus further satisfies: a value of a ratio of $H1$ to $H3$ is greater than 1 and less than and equal to 2.

3. The micro light-emitting diode apparatus as claimed in claim 1, wherein the micro light-emitting diode apparatus further satisfies:

$$(H2+H3) > H1 > 1/2*(H2+H3).$$

4. The micro light-emitting diode apparatus as claimed in claim 1, wherein the micro light-emitting diode apparatus further satisfies: $HL > H2$, $HL > H3$, wherein $HL$ is a maximum height of the micro light-emitting diode relative to the substrate.

5. The micro light-emitting diode apparatus as claimed in claim 1, wherein each of the micro light-emitting diodes comprises:
an epitaxial structure, comprising:
a first-type semiconductor layer;
a second-type semiconductor layer; and
a light-emitting layer, located between the first-type semiconductor layer and the second-type semiconductor layer, wherein the micro light-emitting diode apparatus further satisfies: $H2 > HM$, wherein $HM$ is a maximum height of the light-emitting layer relative to the substrate.

6. The micro light-emitting diode apparatus as claimed in claim 5, wherein the connecting portion is connected to and covers a side surface of the epitaxial structure.

7. The micro light-emitting diode apparatus as claimed in claim 5, wherein the first-type semiconductor layer is an n-type semiconductor layer, and the second-type semiconductor layer is a p-type semiconductor layer.

* * * * *